United States Patent [19]

Cheng et al.

[11] Patent Number: 5,728,615
[45] Date of Patent: Mar. 17, 1998

[54] METHOD OF MANUFACTURING A POLYSILICON RESISTOR HAVING UNIFORM RESISTANCE

[75] Inventors: Shen-Wen Cheng, Tainan; Chun-Lin Cheng, Taipei, both of Taiwan

[73] Assignee: Vanguard International Semiconductor Corporation, Hsinchu, Taiwan

[21] Appl. No.: 683,367

[22] Filed: Jul. 18, 1996

[51] Int. Cl.$^6$ ............................................... H01L 21/8234
[52] U.S. Cl. ........................ 438/238; 438/382; 438/330
[58] Field of Search .............................. 438/171, 190, 438/210, 238, 330, 382

[56] References Cited

U.S. PATENT DOCUMENTS 4,475,964  10/1984  Ariizumi et al. ........................ 148/187
5,461,000  10/1995  Liang ........................................ 437/60

*Primary Examiner*—John Niebling
*Assistant Examiner*—Joni Y. Chang
*Attorney, Agent, or Firm*—Christensen, O'Connor, Johnson & Kindness PLLC

[57] ABSTRACT

A method of manufacturing a polysilicon resistor which has a uniform high resistance includes a thermal process to increase the hydrogen concentration uniformity in the polysilicon resistor. The thermal step increases the diffusion of the hydrogen into and out of the third polysilicon, thereby helping to equalize the hydrogen concentration within the polysilicon resistor. The more uniform hydrogen concentration causes the resistance of the polysilicon resistor to be more uniform.

45 Claims, 4 Drawing Sheets

METHOD OF MANUFACTURING A POLYSILICON RESISTOR HAVING UNIFORM RESISTANCE

FIELD OF THE INVENTION

The present invention relates to semiconductor integrated circuit fabrication and, more particularly, to methods of fabricating a polysilicon resistor.

BACKGROUND

Static random access memories (SRAMs) are widely used in many applications. One reason for the popularity of SRAMs is that they do not require periodic refresh signals in order to retain their stored data, unlike dynamic random access memories (DRAMs). Typically, the bit state of a SRAM memory cell is stored in a flip-flop, commonly implemented with a pair of cross-coupled inverters. As is well known in the an of digital circuits, a flip-flop is capable of storing a bit, i.e., the output state of a flip-flop circuit is stable at only one of two possible logic states.

FIG. 1 is a schematic diagram of a conventional SRAM memory cell 1. As shown in FIG. 1, the SRAM memory cell 1 includes a flip-flop implement with a pair of inverter circuits. The inverters are formed by metal oxide semiconductor field effect transistors (MOSFETs) $T_1$ and $T_2$ and high resistance load resistors $R_1$ and $R_2$. The first inverter circuit is formed by MOSFET $T_1$ and resistor $R_1$, with the resistor $R_1$ connected in series between the drain of the MOSFET $T_1$ a supply voltage source Vcc. The source of the MOSFET $T_1$ is connected to a ground potential source Vss. Likewise, the second inverter is formed by MOSFET T2 and resistor $R_2$ similarly connected between the supply voltage source Vcc and the ground potential source Vss. The gate of each inverter's MOSFET is connected to the output node of the other inverter, i.e., the node where the resistor is connected to the drain of the MOSFET.

The memory cell 1 also includes two transfer MOSFETs $T_3$ and $T_4$. Each transfer MOSFET has its channel connected between the output node of an inverter and a data line and its gate connected to a word line. More specifically, MOSFET T3 has its channel connected to a data line $DL_1$ and the output node of the first inverter. The gate of MOSFET $T_3$ is connected to a word line WL. Similarly, the MOSFET $T_4$ has its channel connected between a data line $DL_2$ and the output node of the second inverter and its gate connected to the word line WL. In a typical SRAM, the data lines $DL_1$ and $DL_2$ carry a differential signal to and from the SRAM memory cell 1. The operation of the SRAM memory cell 1 is well known in the art of SRAMs and need not be described in detail.

The resistors $R_1$ and $R_2$ serve as load devices in the inverters of the SRAM cell. In order to minimize power consumption and yet maintain an optimum soft error rate, high valued load resistors are used to obtain small load current. For example, a resistance in the range of about 10–100 giga-ohms is often used. Typically, the resistors $R_1$ and $R_2$ are implemented with a doped polysilicon film. However, the resistance of these polysilicon resistors often varies in conventional SRAM memory cell fabrication. This variation can be up to two orders of magnitude. It is thought that the non-uniform resistance is caused by hydrogen penetration in the polysilicon. The conventional solution to this problem is to cap the polysilicon resistor with a nitride layer or "cap" to prevent the hydrogen penetration. Of course, forming the nitride cap undesirably increases the complexity of the manufacturing process.

SUMMARY

In accordance with the present invention, a method of manufacturing a polysilicon resistor having a uniform high resistance is provided. In one embodiment, a polysilicon layer is deposited above a semiconductor substrate. A dielectric layer is then deposited above the polysilicon layer. The resulting structure is then thermally treated to increase the diffusion of hydrogen within the polysilicon layer. As a result, hydrogen both moves away from portions of the polysilicon layer having a high concentration of hydrogen and moves into portions of the polysilicon layer having a low concentration of hydrogen. Consequently, the hydrogen concentration in the polysilicon layer becomes more uniform, thereby increasing the uniformity of resistivity of the polysilicon layer. Thus, according to the present invention, hydrogen is allowed to penetrate the polysilicon layer and is equalized using a relatively simple thermal treatment. Thus, the invention is unlike conventional processes in which relatively complex process steps are required to form a nitride cap to try to completely prevent hydrogen penetration into the polysilicon layer.

In one embodiment adapted for fabricating a SRAM memory cell, a silicon dioxide layer is formed on a substrate having source/drain impurity regions and field oxide (FOX) region. A doped first polysilicon layer is then deposited over the FOX region. Next, photolithography and etching processes are performed to etch the first polysilicon layer. A buried contact is formed by drying etching. Then, a second polysilicon layer is formed on the substrate, the first silicon dioxide layer and FOX region. A silicide layer is then formed on the second polysilicon layer. Next, photolithography and etching processes are performed to etch the silicon dioxide layer, the first polysilicon layer, the second polysilicon layer and the silicide layer to form gates aligned with the source/drain impurity regions.

A first insulator layer is then formed on the gate and on the substrate. Then an anisotropic etching is performed to etch the first insulator layer to form side wall spacers. A second insulator layer is then formed over the resulting structure. Photolithography and etching processes are performed to etch the second insulator layer to generate a contact hole exposing the silicide layer over the second polysilicon layer located above the FOX region. A third polysilicon layer is formed over the second insulator layer and the silicide layer, contacting the silicide layer through the contact hole. The third polysilicon layer is doped by using arsenic or phosphorus and serves. Subsequently, photolithography and etching processes are performed to etch the third polysilicon layer and define the polysilicon load resistor.

Next, a third insulator layer is deposited over the resulting structure. A dielectric layer is then formed on the third insulator layer. Subsequently, in this embodiment, a thermal treating process is performed in a nitrogen gas ambient at a temperature of about 800°–875° C. for about 30 minutes. Then a photolithography and an etching processes are performed to form a contact hole through the dielectric layer and the third and second insulator layers. A metal plug is formed in the contact hole, contacting with the substrate. Then a second metal layer is deposited on the metal plug. A first inter metal dielectric (IMD) layer is formed on the second metal layer. In this embodiment, the first IMD layer is an PE-SiH$_4$ oxide/SOG/PE-TEOS oxide stack. Then a photolithography and an etching processes are performed to form a via hole through IMD layer. Subsequently, an extra thermal treatment is performed in a nitrogen and hydrogen gas ambient at a temperature of about 400°–450° C. for about 30–60 minutes. The thermal treatment is used to improve the uniformity of the hydrogen concentration in the polysilicon load resistor as described above. Subsequently, a third metal layer is formed on the first IMD layer. In this embodiment, the third metal layer is a Ti/AlSiCu stack. Next, photolithography and etching processes are performed to etch the third metal layer. As a result, SRAM memory cells according to the present invention have load resistors with more uniform resistance compared to SRAM memory cells made with conventional processes.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 2:
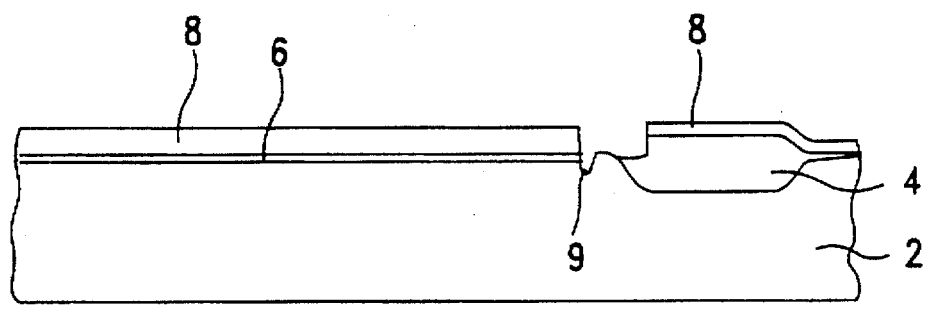
FIG. 2–9 are cross-sectional representations of various stages of fabricating a SRAM memory cell with a polysilicon resistor according to one embodiment of the present invention.

FIG. 2 is a cross-sectional view illustrating an early stage in forming a polysilicon resistor for a SRAM memory cell, according to one embodiment of the present invention. A single crystal silicon substrate 2 which has a <100> crystallographic orientation is provided. The substrate 2 may have source/drain impurity regions formed therein. The source/drain impurity regions can be formed using standard processes well known in the art of SRAM fabrication. A thick field oxide (FOX) region 4 is formed to provide isolation between devices on the substrate 2. The FOX region 4 is created in a conventional manner. For example, the FOX region 4 can be formed after photolithography and dry etching steps to etch a silicon nitride-silicon dioxide composition layer. After the photoresist is removed and wet cleaned, a thermal oxidation in an oxygen steam ambient is used to grow the FOX region 4 to a thickness about 4000–6000 angstroms.

After forming the FOX region 4, a silicon dioxide layer 6 is created on the top surface of the substrate 2 to serve as the gate oxide for subsequently formed MOSFETs. The term MOSFET is used herein to also refer to silicon gate technologies. In one embodiment, the silicon dioxide layer 6 is formed by using an oxygen-steam ambient, at a temperature of about 800°–900° C. Alternatively, the oxide layer 6 may be formed using any suitable oxide chemical compositions and procedures. In this embodiment, the thickness of the silicon dioxide layer 6 is approximately 100 angstroms.

A doped first polysilicon layer 8 is then formed over the FOX region 4 and the silicon dioxide layer 6 using a low pressure chemical vapor deposition (LPCVD) process. In this embodiment, the first polysilicon layer 8 has a thickness of about 500 angstroms. Next, standard photolithography and dry etching steps are used to form a buried contact region 9 and, as shown in FIG. 2, to expose a portion of the FOX region 4 proximate to the buried contact region 9. The use of buried contacts in semiconductor process provides an important benefit in that it makes available an additional level of interconnect on the integrated circuit.

Figure 1:
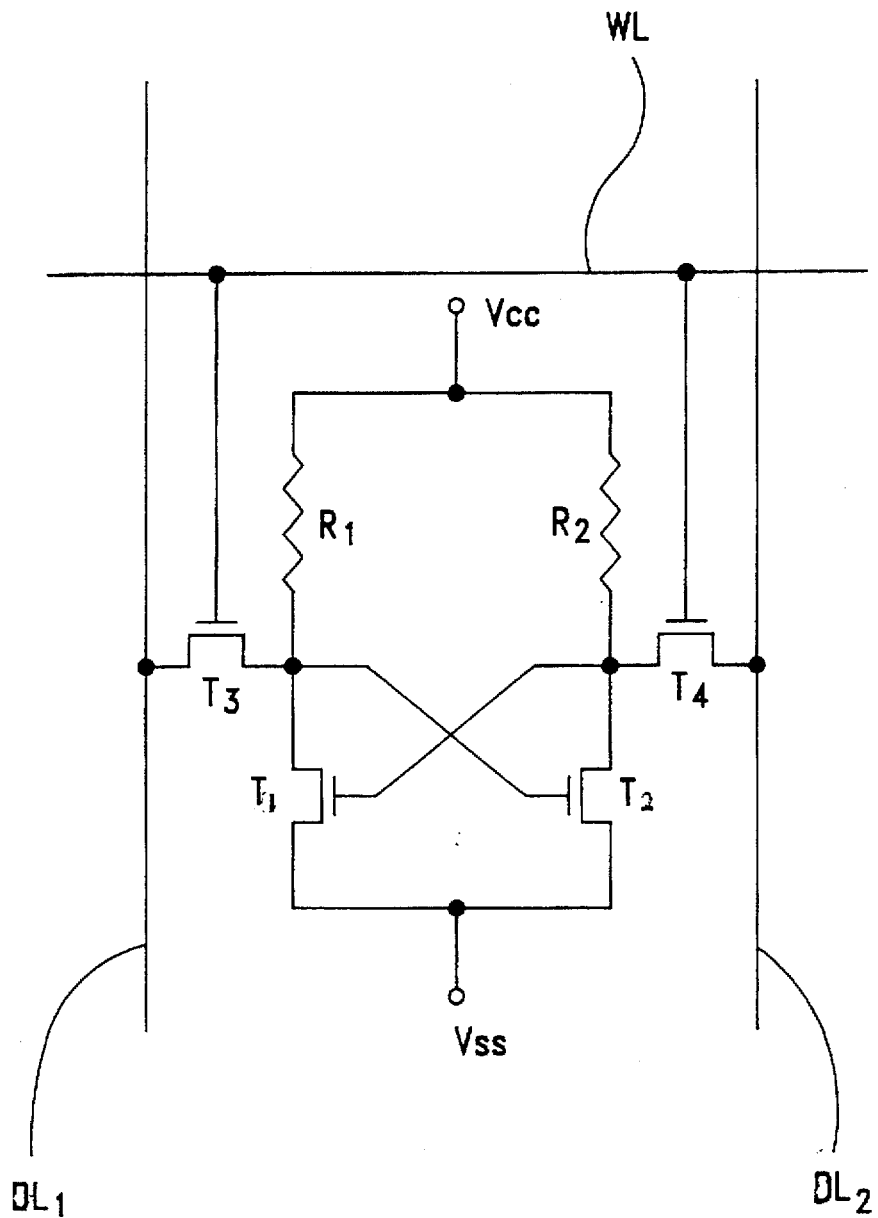
FIG. 1 is a schematic diagram of a conventional SRAM memory cell.
Figure 3:
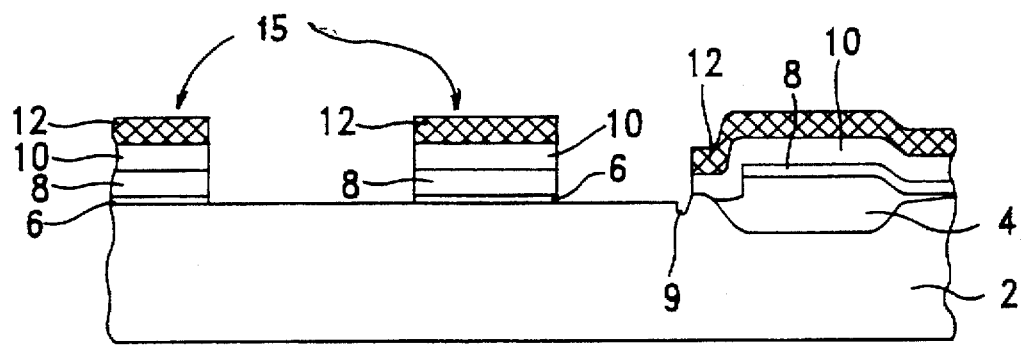

FIG. 3 illustrates a next stage in fabricating the SRAM memory cell. An undoped second polysilicon layer 10 is then formed by LPCVD on the exposed portions of the substrate 2, the silicon dioxide layer 6 and the FOX region 4. Subsequently, the second polysilicon layer 10 is doped with phosphorus using any suitable method. In this embodiment, the polysilicon layer 10 is doped by ion implantation with a dosage of about 5E 13–5E16 atoms/cm$^2$ with an energy of about 30–50 KeV. The thickness of the first polysilicon layer 10 is about 1000 angstroms. A tungsten silicide layer 12 is then formed on the polysilicon layer 10. In this embodiment, a conventional CVD process is used to form the tungsten silicide (WSi$_x$) layer 12 to a thickness of about 1000–1500 angstroms by reacting tungsten fluoride (WF$_6$) with silane (SiH$_4$). Standard photolithography and etching processes are performed to etch the silicon dioxide layer 6, the first polysilicon layer 8, the second polysilicon layer 10 and the tungsten silicide layer 12 to define gate structures 15 aligned with the aforementioned source/drain impurity regions for two MOSFETs. In this embodiment, these two MOSFETs form one half a conventional four transistor SRAM memory cell. Thus, one MOSFET corresponds to MOSFET T$_1$ (FIG. 1) and the other corresponds to MOSFET T$_2$ (FIG. 1). The other half of the SRAM memory cell is formed in a similar manner and, accordingly, need not be shown. In addition, as shown in FIG. 3, the segment of the second polysilicon layer 10 remaining above the FOX region 4 (after the photolithography and etching processes) contacts the substrate 2 near the buried contact region 9.

Figure 4:
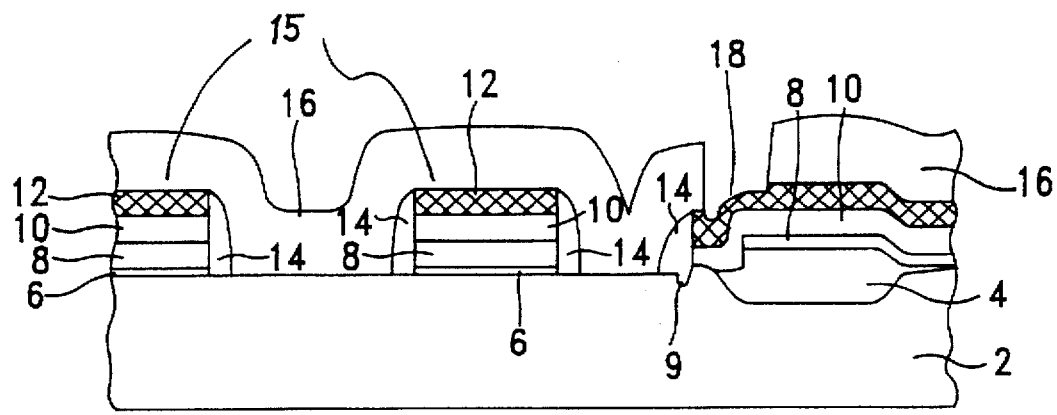

Referring to FIG. 4, a first tetraethylorthosilicate (TEOS) layer is formed on the gate structure and the substrate 2. The thickness of the first TEOS layer is about 1000–2000 angstroms. An anisotropic etching is then performed to etch the first TEOS layer to form side wall spacers 14 around the gate structures 15 and in the buried contact region 9. A second TEOS layer 16 is then deposited to have a thickness of about 1000–2000 angstroms. Photolithography and etching processes are then performed to etch the second TEOS layer 16 to form a contact hole 18 and expose a portion of the silicide layer 12 on top of the second polysilicon layer 10 above the FOX region 4.

Figures 5, 6, 7:
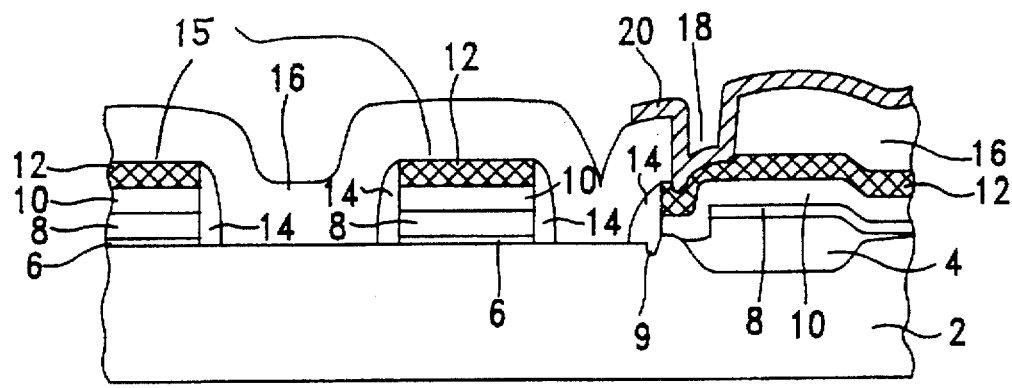

Referring to FIG. 5, a third polysilicon layer is conformally formed over the second TEOS layer 16, the tungsten silicide layer 12 and along the surface of the contact hole 18. In this embodiment, the third polysilicon layer is formed by LPCVD and serves as the polysilicon load resistor for the SRAM memory cell. The thickness of the third polysilicon layer is 500–600 angstroms. In order to minimize power consumption and maintain an optimum soft error rate, very high valued load resistor must be used to abtain small load current. In one embodiment, the third polysilicon layer 20 is doped with arsenic. Alternatively, phosphorus can be used as the dopant. The dosage of the impurities is between 5E13–8E13 atoms/cm$^2$. The energy of the implantation is about 30–50 KeV. Subsequently, a photoresist is patterned for Vcc implantation. In this embodiment, the energy of the implantation is about 30–50 KeV and the dosage of the impurities is between 1E15–5E15 atoms/cm$^2$. Photolithography and etching processes are performed to etch the third polysilicon layer, thereby defining a polysilicon resistor 20.

Referring to FIG. 6, a third TEOS layer 22 is deposited over the structure of FIG. 5. In this embodiment, the third TEOS layer 22 has a thickness of about 1000–2000 angstroms. A dielectric layer 24 is then formed on the third TEOS layer 22. The thickness of the dielectric layer 24 is about 4500 angstroms. Any suitable material can be used to form the dielectric layer 24 such as, for example, borophosphosilicate glass (BPSG). The third TEOS layer 22 and the dielectric layer 24 are used to prevent the active regions from contacting with other elements.

Subsequently, a thermal process is performed in nitrogen gas ambient about 30 minutes, at temperature 800°–875° C. The thermal step is used to equalize the hydrogen concentration in the polysilicon resistor 20.

Referring to FIG. 7, standard photolithography and etching processes are used to form a contact hole 26 through the third TEOS layer 22, the dielectric layer 24 and the second TEOS layer 16. As shown in FIG. 7, the contact hole 26 is formed between the two MOSFET gate structures 15. The hole is formed by using any suitable process, such as, for example, a dry etching process. Then a contact anneal process is performed in N ambient about 30 minutes, at temperature between a range about 600°–800° C.

Figure 8:
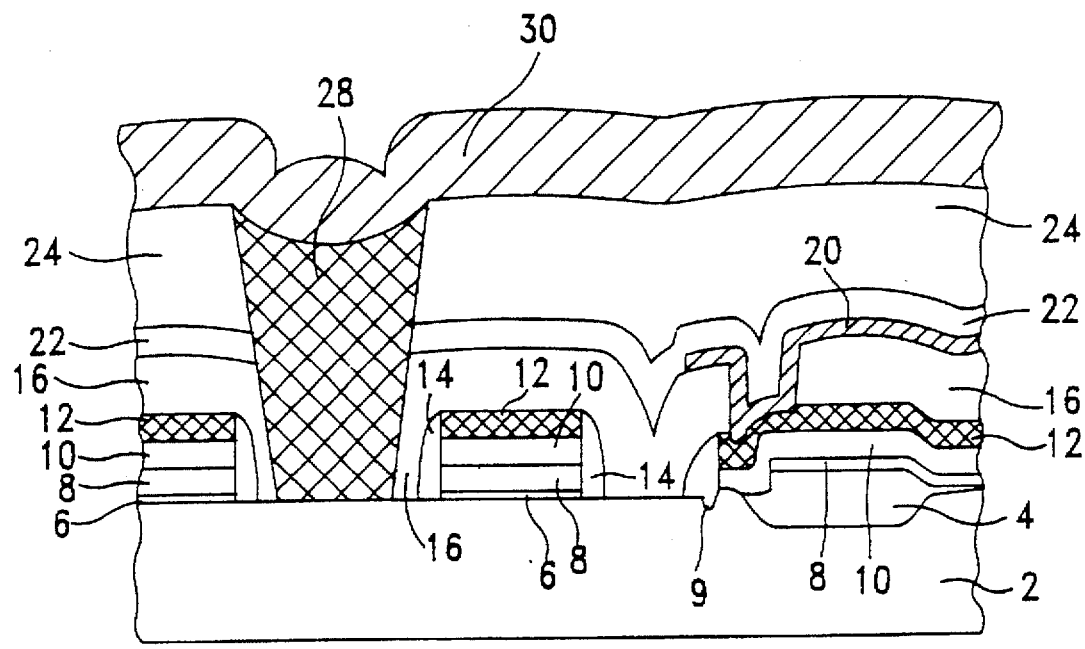

Referring to FIG. 8, a first metal layer is formed on the BPSG layer 24. Any suitable material can be used to form the metal layer such as, for example, tungsten. Next, an etching process is utilized to etch back the tungsten layer to form a tungsten plug 28, which is used to contact the substrate 2. Then a second metal layer 30 is deposited on the tungsten plug 28. The second metal layer 30 is formed by two steps of deposition. First, a Ti/TiN composition layer is formed. The thickness of the Ti sublayer is about 400–800 angstroms thick, while the TiN sublayer is about 800–1200 angstroms thick. Then AlSiCu/TiN composition layer is subsequently formed on the first composition layer. In this embodiment, the thickness of the AlSiCu sublayer is about 4000–5000 angstroms, and the thickness of the TiN sublayer about 300–500 angstroms.

Figure 9:
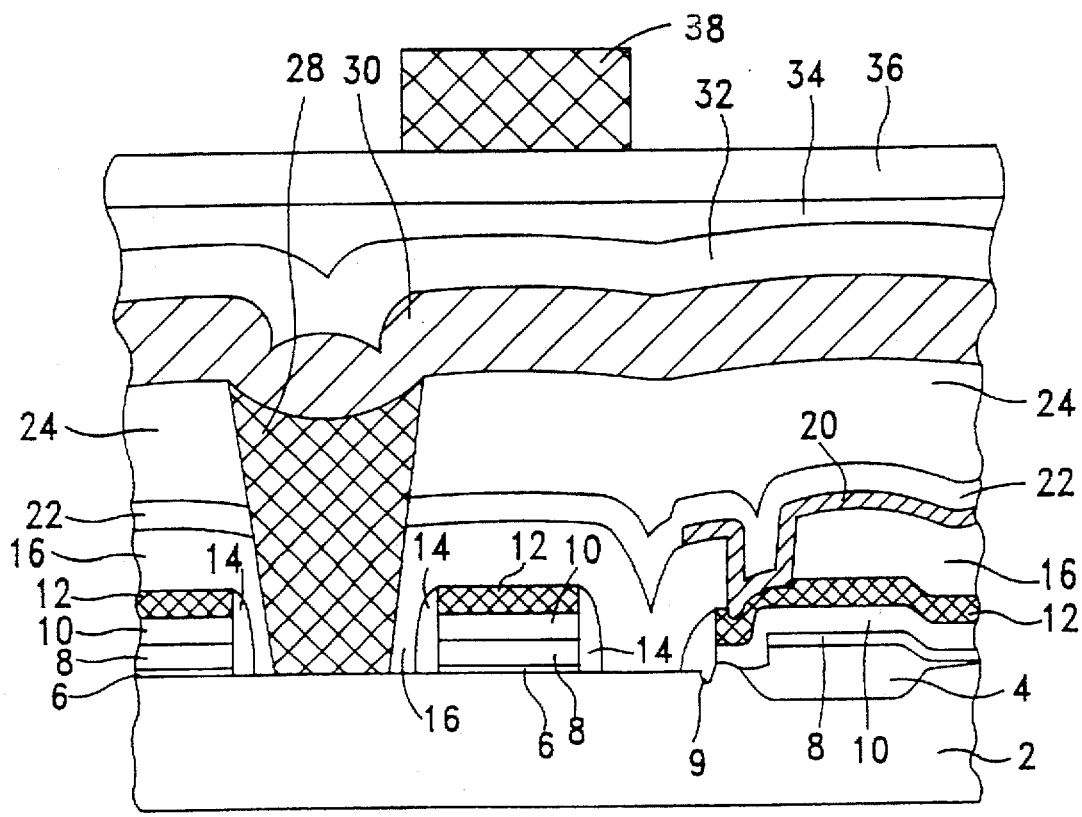

Referring to FIG. 9, a first inter metal dielectric (IMD) layer 32 is formed to have a thickness of about 3000–5000 angstroms. In this embodiment, the first IMD layer 32 is an insulated oxide layer of PE-Oxide. Then a photolithography and an etching processes are performed to form via holes through IMD layer. Subsequently, an thermal treatment is performed in a nitrogen gas with hydrogen gas ambient at a temperature of about 400°–450° C. for about 30–60 minutes. This thermal step is used to equalized the hydrogen concentration in the polysilicon resistor 20. The thermal step increases the diffusion of the hydrogen into and out of the polysilicon resistor 20, which causes the hydrogen concentration within the polysilicon resistor 20 to be more uniform. The more uniform hydrogen concentration of the polysilicon resistor 20 causes the resistor to have a more uniform resistivity. Accordingly, the resistance of polysilicon resistors formed according to the present invention are more uniform throughout the SRAM, throughout the wafer, and from wafer-to-wafer. Subsequently, a third metal layer 38 is formed on the second IMD layer 36. In this embodiment, the third metal layer 38 is a Ti/AlSiCu/TiN composition layer. The thickness of the composition layer is respectively 800–1200/8000–9000/300–500 angstroms. Next, a photolithography and an etching process is performed to etch the third metal layer 38, as shown in FIG. 9. The third metal layer 38 is typically utilized to form interconnects with other elements on the same chip.

The embodiments described above are illustrative of the principles of the present invention and are not intended to limit the invention to the particular embodiments described. Accordingly, while the preferred embodiment of the invention has been illustrated and described, it will be appreciated that, in view of this disclosure, various changes can be made to form other embodiments without departing from the spirit and scope of the invention.

The embodiments of the invention in which an exclusive property or privilege is claimed are defined as follows:

1. A method of fabricating a polysilicon resistor on semiconductor substrate, said method comprising:

forming a polysilicon layer above said semiconductor substrate;

forming a first dielectric layer above said polysilicon layer;

forming a conductive layer above said first dielectric layer;

forming a second dielectric layer (intermetal dielectric layer; IMD) above said conductive layer;

providing a nitrogen gas and hydrogen gas atmosphere for said semiconductor substrate, said polysilicon layer and said dielectric layer; and heating said polysilicon layer, wherein uniformity of hydrogen concentration in said polysilicon layer is increased.

2. The method of claim 1 wherein said heating said polysilicon layer comprises heating said polysilicon layer to a temperature of about 400°–450° C. for about 30–60 minutes.

3. The method of claim 2 wherein said polysilicon layer is patterned and etched to form a load resistor for a metal oxide semiconductor field effect transistor (MOSFET) inverter.

4. The method of claim 3 wherein said MOSFET inverter is used to implement a static random access memory.

5. A method of forming a polysilicon resistor in a SRAM memory cell, said method comprising:

forming a silicon dioxide layer on a semiconductor substrate having impurity regions formed therein;

forming a buried contact in said substrate;

forming a first polysilicon layer on said silicon dioxide layer and on said substrate;

forming a metal silicide layer on said first polysilicon layer;

etching said silicon dioxide layer, said first polysilicon layer and said metal silicide layer to form a gate structure aligned between two impurity regions in said semiconductor substrate;

forming a first dielectric layer over said gate structure, said substrate and said metal silicide layer;

anisotropically etching said first dielectric layer to form a side wall spacer adjacent to said gate structure;

forming a second dielectric layer on said gate structure, said substrate and said metal silicide layer;

forming a contact hole in said second dielectric layer, whereby a portion of said metal silicide layer is exposed;

forming a second polysilicon layer on said second dielectric layer and along the surface of said contact hole;

patterning a photoresist on said second polysilicon layer and etching said second polysilicon layer to form a polysilicon load resistor;

forming a third dielectric layer on said second dielectric layer, on said second polysilicon layer; and forming a fourth dielectric layer on said third dielectric layer.

6. The method of claim 5, further comprising:

patterning a photoresist on said fourth dielectric layer and etching said fourth dielectric layer, said third dielectric layer and said second dielectric layer to form a contact hole through said fourth dielectric layer, said third dielectric layer and said second dielectric layer to said substrate;

forming a metal plug in said contact hole;

forming a first conductive layer on said fourth dielectric layer and on said metal plug;

forming a first inter metal dielectric layer on said first metal layer;

forming a spin on glass (SOG) layer on said first inter metal dielectric layer;

forming a second inter metal dielectric layer on said SOG layer;

thermally treating said semiconductor substrate and layers formed thereon, wherein diffusion of hydrogen into and out of said second load resistor is increased, whereby uniformity of hydrogen concentration within said load resistor is increased.

forming a second conductive layer on said second inter metal dielectric layer; and patterning a photoresist on said second conductive layer and etching said second conductive layer.

7. The method of claim 6, further comprising forming a third polysilicon layer on said silicon dioxide layer before forming said buried contact.

8. The method of claim 6, further comprising performing an annealing process after said contact hole is formed.

9. The method of claim 8, wherein said annealing is performed in a nitrogen gas ambient for about 30 minutes and at a temperature range of about 600°–800° C.

10. The method of claim 6, wherein said first polysilicon layer is formed to have a thickness of about 1000 angstroms.

11. The method of claim 10, further comprising ion implanting said first polysilicon layer with phosphorus.

12. The method of claim 11, wherein said ion implanting comprises implanting about 5E13–5E16 phosphorus atoms/cm$^2$ with an energy of about 30–50 KeV.

13. The method of claim 12, wherein said third polysilicon layer comprises doped polysilicon having a thickness of about 500 angstroms.

14. The method of claim 5, wherein said metal silicide layer comprises a tungsten silicide layer having a thickness of about 1000–1500 angstroms.

15. The method of claim 5, wherein said first dielectric layer comprises tetraethylorthosilicate (TEOS).

16. The method of claim 15, wherein said first dielectric layer is formed to have a thickness of about 1000–2000 angstroms.

17. The method of claim 5, wherein said second dielectric layer comprises TEOS.

18. The method of claim 10, wherein said second dielectric layer is formed to have a thickness of about 1000–2000 angstroms.

19. The method of claim 5, wherein said third dielectric layer comprises TEOS.

20. The method of claim 14, wherein said third dielectric layer is formed to have a thickness of about 1000–2000 angstroms.

21. The method of claim 5, wherein said fourth dielectric layer comprises borophosphosilicate glass (BPSG).

22. The method of claim 21, wherein said fourth dielectric layer is formed to have a thickness of about 4500 angstroms.

23. The method of claim 5, wherein said second polysilicon layer is formed to have a thickness of about 500–600 angstroms.

24. The method of claim 5, wherein said second polysilicon layer is doped with arsenic.

25. The method of claim 5, wherein said second polysilicon layer is doped with phosphorus.

26. The method of claim 25, wherein said second polysilicon layer is doped with a dosage of about 5E13–8E13 atoms/cm$^2$ with an energy of about 30–50 KeV.

27. The method of claim 6, wherein said thermally treating said substrate and layers deposited thereon comprises heating said substrate and said layers deposited thereon in a nitrogen gas with hydrogen gas ambient for about 30–60 minutes at temperature of about 400°–450° C.

28. A method of fabricating a polysilicon load resistor in SRAM memory cell, said method comprising the step of:

forming a silicon dioxide layer on a semiconductor substrate;

forming a first polysilicon layer on said silicon dioxide layer;

forming a buried contact by using dry etching process;

forming a second polysilicon layer on said first polysilicon layer and on said substrate;

forming a silicide layer on said second polysilicon layer;

etching said silicon dioxide layer, said first polysilicon layer, said second polysilicon layer and said silicide layer to form a gate structure;

forming a first tetraethylorthosilicate (TEOS) layer over said gate structure, said substrate and said silicide layer;

anisotropically etching said first TEOS layer to form a side wall spacer adjacent to said gate structure;

forming a second TEOS layer on said gate structure, said substrate and said silicide layer;

forming a contact hole in said second TEOS layer and to expose a portion of said silicide layer;

forming a third polysilicon layer on said second TEOS layer and along the surface of said contact hole;

patterning a photoresist on said third polysilicon layer and etching said third polysilicon layer to form polysilicon load resistor;

forming a third TEOS layer on said second dielectric layer and on said third polysilicon layer;

forming a borophosphosilicate glass (BPSG) layer on said third TEOS layer;

patterning a photoresist on said BPSG layer and etching said BPSG layer, said third TEOS layer and said second TEOS layer to form a contact hole through said BPSG layer, said third TEOS layer and said second TEOS layer to said substrate;

performing a contact anneal;

forming a first metal layer on said BPSG layer, wherein said contact hole is filled with said first metal layer;

forming a metal plug by etching said first metal layer;

forming a second metal layer on said BPSG layer and on said metal plug;

forming a first inter metal dielectric layer on said second metal layer;

forming a spin on glass (SOG) layer on said first inter metal dielectric layer;

forming a second inter metal dielectric layer on said SOG layer;

thermally treating the third polysilicon layer, wherein the third polysilicon layer has a hydrogen concentration with increased uniformity.

forming a third metal layer on said first inter metal dielectric layer; and patterning a photoresist on said third metal layer and etching said third metal layer.

29. The method of claim 28, wherein said contact annealing is performed in N ambient about 30 minutes, at a temperature between a range about 600°–800° C.

30. The method of claim 28, wherein said first polysilicon layer is doped polysilicon, having a thickness of about 500 angstroms.

31. The method of claim 28, wherein said second polysilicon layer is formed to have a thickness of about 1000 angstroms.

32. The method of claim 31, wherein said first polysilicon layer is implanted by phosphorus.

33. The method of claim 32, wherein said implantation has a dosage of about 5E13–5E16 atoms/cm$^2$, the energy of said implantation is about 30–50 KeV.

34. The method of claim 28, wherein said silicide layer comprises tungsten silicide having a thickness of about 1000–1500 angstroms.

35. The method of claim 28, wherein said first TEOS layer is formed to have a thickness of about 1000–2000 angstroms.

36. The method of claim 28, wherein said second TEOS layer is formed to have a thickness of about 1000–2000 angstroms.

37. The method of claim 28, wherein said third TEOS layer is formed to have a thickness of about 1000–2000 angstroms.

38. The method of claim 28, wherein said BPSG layer is formed to have a thickness of about 4500 angstroms.

39. The method of claim 28, wherein said third polysilicon layer is formed to have a thickness of about 500–600 angstroms.

40. The method of claim 39, wherein said second polysilicon layer is doped with arsenic.

41. The method of claim 40, wherein the dosage of said implantation is between 5E13–8E13 atoms/cm$^2$, the energy of said implantation is about 30–50 KeV.

42. The method of claim 28, wherein said thermal process is performed in $N_2$ with $H_2$ ambient about 30 minutes, at temperature 400°–450° C.

43. The method of claim 39 wherein said second polysilicon layer is doped with phosphorus.

44. The method of claim 28, wherein said first metal layer is composed of Ti/TiN composition layer, the thickness of said Ti layer is about 400–800 angstrom, the thickness of said TiN layer is about 800–1200 angstroms.

45. The method of claim 28, wherein said second metal layer is composed of AlSiCu/Ti composition layer, the thickness of said AlSiCu layer is about 4000–5000 angstrom, the thickness of said Ti layer is about 300–500 angstroms.

* * * * *